United States Patent

Nguyen et al.

Patent Number: 5,904,565
Date of Patent: May 18, 1999

[54] LOW RESISTANCE CONTACT BETWEEN INTEGRATED CIRCUIT METAL LEVELS AND METHOD FOR SAME

[75] Inventors: Tue Nguyen, Vancouver; Sheng Teng Hsu, Camas, both of Wash.

[73] Assignees: Sharp Microelectronics Technology, Inc., Camas, Wash.; Sharp Kabushiki Kaisha, Osaka, Japan

[21] Appl. No.: 08/896,114

[22] Filed: Jul. 17, 1997

[51] Int. Cl.[6] .................................................. H01L 21/44
[52] U.S. Cl. .................. 438/687; 438/622; 438/637; 438/638; 438/666; 438/672
[58] Field of Search ..................... 438/608, 656, 438/660, 686, 687, 643, 644, 655, 672, 622, 637, 638, 666

[56] References Cited

U.S. PATENT DOCUMENTS

| | | | |
|---|---|---|---|
| 5,529,953 | 6/1996 | Shoda | 437/189 |
| 5,686,354 | 11/1997 | Avanizo et al. | 437/190 |
| 5,705,849 | 1/1998 | Zheng et al. | 257/530 |

OTHER PUBLICATIONS

Paper titled, "Ultra–Law, Resistance Direct Contact Cu Via Technology Using In–situ Chemical Vapor Cleaning", by Y. Tsuchiya, K. Ueno, V. M. Donnelly, T. Kikkawa, Y. Hayashi, A. Kobayashi and A. Sekiguchi published in the 1997 Symposium on VLSI Technology Digest of Technical Papers, pp. 59–60.

Primary Examiner—Charles Bowers
Assistant Examiner—Reneé R. Berry
Attorney, Agent, or Firm—Gerald W. Maliszewski; David C. Ripma

[57] ABSTRACT

A method of forming a direct, copper-to-copper, connection between levels in an IC is disclosed. A via interconnection is formed by isotropically depositing a barrier material in a via through an insulator to a lower copper level, and then anisotropically etching the via to remove the barrier material covering the lower copper level. The anisotropic etch leaves the barrier material lining the via through the insulator. The subsequently deposited upper metal level then directly contacts the lower copper level when the via is filled. A dual damascene interconnection is formed by etching an interconnection trench in an insulator and anisotropically depositing a non-conductive barrier material in the trench bottom. Then a via is formed from the trench interconnect to a lower copper level. As above, a conductive barrier material is isotropically deposited in the trench/via structure, and anisotropically etched to remove the barrier material covering the lower copper level. The insulating barrier material, lining the trench and via, remains. An IC via interconnection structure and a dual damascene interconnection structure, made in accordance with the above described methods, are also provided.

19 Claims, 10 Drawing Sheets

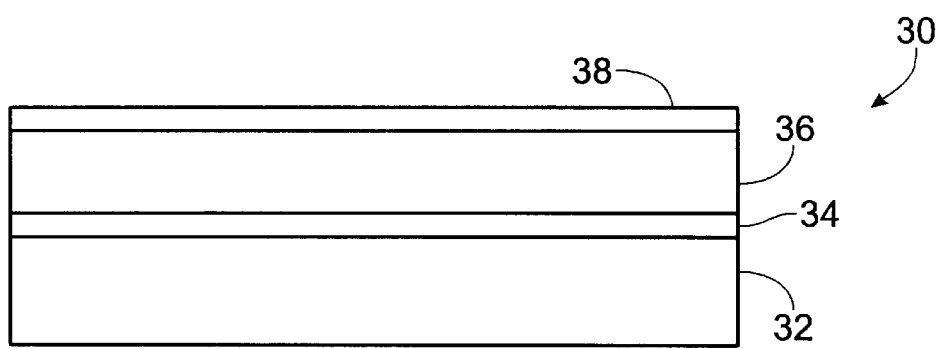
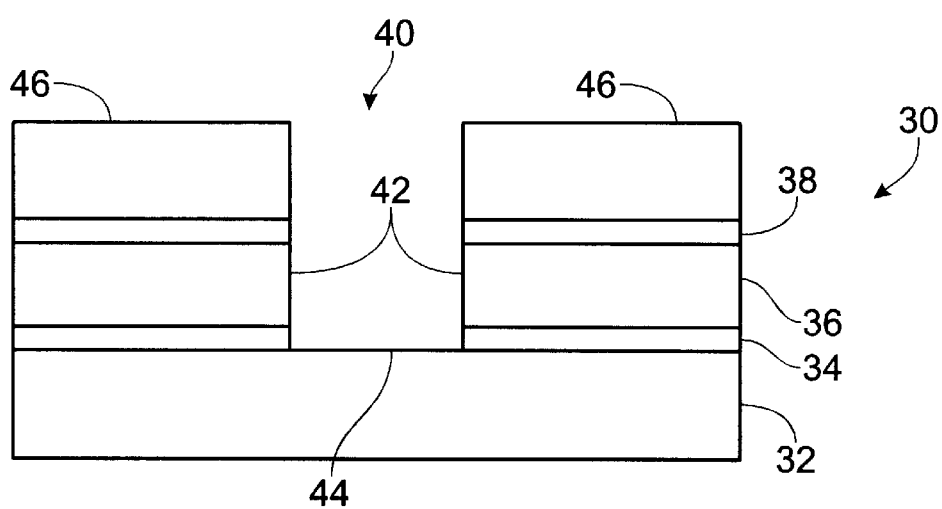
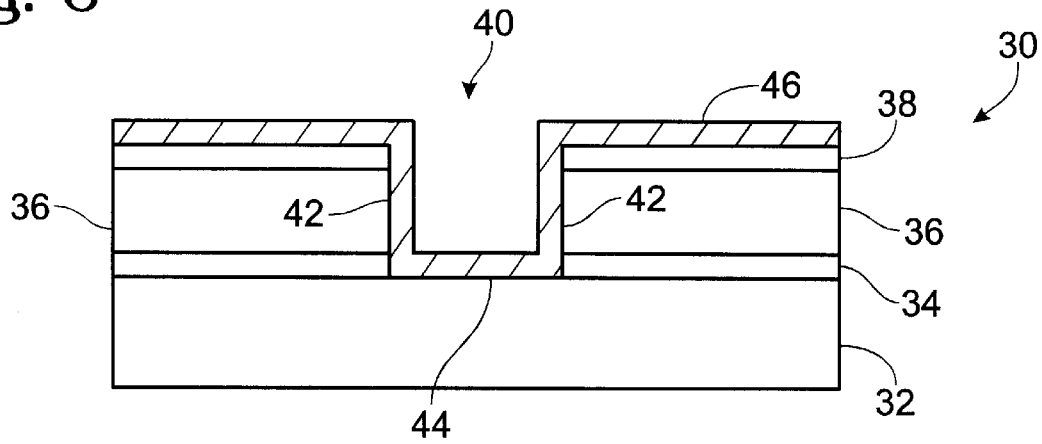

LOW RESISTANCE CONTACT BETWEEN INTEGRATED CIRCUIT METAL LEVELS AND METHOD FOR SAME

BACKGROUND AND SUMMARY OF THE INVENTION

This invention relates generally to integrated circuit (IC) processes and fabrication, and more particularly, to copper interconnection structures, and a method of forming copper interconnection structures, without intervening contamination barrier layers, to improve electrical conductivity between the copper levels.

The demand for progressively smaller, less expensive, and more powerful electronic products, in turn, fuels the need for smaller geometry integrated circuits, and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects and vias to have both low resistivity, and the ability to withstand volatile process environments. Aluminum and tungsten metals are often used in the production of integrated circuits for making interconnections, or vias, between electrically active areas. These metals are popular because they are easy to use in a production environment, unlike copper which requires special handling.

Copper (Cu) is a natural choice to replace aluminum in the effort to reduce the size of lines and vias in an electrical circuit. The conductivity of copper is approximately twice that of aluminum, and over three times that of tungsten. As a result, the same current can be carried through a copper line having half the width of an aluminum line.

The electromigration characteristics of copper are also much superior to those of aluminum. Aluminum is approximately ten times more susceptible than copper to degradation and breakage through electromigration. As a result, a copper line, even one having a much smaller cross-section than an aluminum line, is better able to maintain electrical integrity.

There have been problems associated with the use of copper, however, in IC processing. Copper contaminates many of the materials used in IC processes and, therefore, care must be taken to keep copper from migrating. Various means have been suggested to deal with the problem of copper diffusion into integrated circuit material. Several materials, particularly refractory metals, have been suggested for use as barriers to prevent the copper diffusion process. Tungsten, molybdenum, and titanium nitride (TiN) are examples of refractory metals which may be suitable for use as copper diffusion barriers. However, the adhesion of copper to these diffusion barrier materials has been an IC process problem, and the electrical conductivity of such materials is an issue in building IC interconnects.

Metal cannot be deposited onto substrates, or into vias, using conventional metal deposition processes, such as sputtering, when the geometries of the selected IC features are small. It is impractical to sputter metal, either aluminum or copper, to fill small diameter vias, since the gap filling capability is poor. To deposit copper, various chemical vapor deposition (CVD) techniques are under development in the industry.

In a typical CVD process, copper is combined with an organic ligand to make a volatile copper compound or precursor. That is, copper is incorporated into a compound that is easily vaporized into a gas. Selected surfaces of an integrated circuit, such as diffusion barrier material, are exposed to the copper containing gas in an elevated temperature environment. When the volatile copper gas compound decomposes, copper is left behind on the heated selected surface. Several copper compounds are available for use with the CVD process. It is generally accepted that the molecular structure of the copper compound, at least partially, affects the conductivity of the copper film residue on the selected surface.

Connections between metal levels, such as copper, which are separated by dielectric interlevels, are typically formed with a damascene method of via formation between metal levels. The underlying copper film is first completely covered with the dielectric, a typical dielectric is silicon dioxide. A patterned photoresist profile is then formed over the dielectric, and an interconnection trench is etched into the dielectric. Another layer of resist has an opening, or hole, in the photoresist overlying the trench, corresponding to the area in the dielectric where the via is to be formed. The dielectric not covered with photoresist is then etched to remove oxide underlying the hole in the photoresist. The photoresist is then stripped away. A thin film of copper, or some other metallic material, is then used to fill the via and trench. A layer consisting of dielectric with a copper via through it now overlies the copper film. The excess copper remaining is removed with a chemical mechanical polish (CMP) process, as is well known in the art. The result is an "inlaid", or damascene, structure.

The formation of copper interconnects requires the copper lines be completely surrounded with barrier layers. The barrier layers can be either conductive or non-conductive. Additional process steps are required in the fabrication process to protect existing barrier layers from etching and to prepare these barrier layers surfaces to adhere to copper and other IC materials. Conductive barriers must also be prepared to have a good electrical interface with metal levels. Barrier layers may be deposited as a film between the various metal levels and dielectric interlevels of the IC. The damascene process may require the formation of additional barrier layers during the formation of a damascene via and trench. Most, preexisting, conductive barrier layers degrade conductance between the copper via and metal levels, but these barriers are often difficult to remove. Procedures have been developed to minimize the resistance between a copper via and an interfacing conductive barrier layer. In addition, compromises are often made between adhesion and conduction characteristics.

A co-pending application, Ser. No. 08/717,267, filed Sep. 20, 1996, entitled, "Oxidized Diffusion Barrier Surface for the Adherence of Copper and Method for Same", invented by Nguyen et al., Attorney Docket No. SMT 123, which is assigned to the same Assignees as the instant patent, discloses a method for oxidizing the diffusion barrier surface to improve the adherence of copper to a diffusion barrier. In low speed electrical circuits the resistance offered by a thin level of oxide is unnoticeable. However, in higher speed applications even a small amount of resistance can increase the propagation delay of electron current across an oxide layer. The primary purpose of this, above mentioned, patent application is to improve the ability of copper to remain deposited on a surface, not on improving the conductivity between copper and another surface.

Another co-pending application, Ser. No. 08/717,315, filed Sep. 20, 1996, entitled, "Copper Adhered to a Diffusion Barrier Surface and Method for Same", invented by Charneski and Nguyen, Attorney Docket No. SMT 243, which is assigned to the same Assignees as the instant patent, discloses a method for using a variety of reactive gas species to improve copper adhesion without forming an oxide layer over the diffusion barrier. However, the focus of this patent is to improve copper adhesion, not to improve the conductivity of copper deposited on a surface.

Another co-pending application, Ser. No. 08/729,567, filed Oct. 11, 1996, entitled, "Chemical Vapor Deposition of Copper on an ION Prepared Conductive Surface and Method for Same," invented by Nguyen and Maa, Attorney Docket No. 114, which is assigned to the same Assignees as the instant patent, discloses a method of preparing a conductive surface, such as a barrier layer, with an exposure to the ions of an inert gas to improve electrical conductivity between a conductive surface and a subsequent deposition of copper. However, the primary purpose of this invention is to prepare a conductive surface that is substantially free of by-products and IC process debris.

Tsuchiya et al., in the article "Ultra-Low Resistance Direct Contact Cu Via Technology Using In-Situ Chemical Vapor Cleaning", 1997 Symposium on VSLI Technology Digest of Technical Papers, pg. 59–60, disclose a method forming a dual damascene direct connection between two copper levels. The connection is formed through two dielectric layers to an underlying copper levels, with barrier layers between the three levels. However, no method is disclosed for forming a via connection between metal levels without an intervening barrier layer. Neither is a method disclosed for forming a dual damascene connection through a single dielectric interlevel when barrier layers must be fabricated for the interconnection trench.

It would be advantageous to employ a method of minimizing the resistance between a copper via and an interfacing metal level in an IC.

It would be advantageous to employ a means of selectively forming barrier layers in a via or damascene structure to eliminate the poorly conductant interfaces between copper and conductive barrier layers.

It would be advantageous to employ a method of selectively depositing and selectively etching barrier layers in the formation of a via or damascene structure. Further, it would be advantageous if the method reduced the number of process steps, and improved the conductivity between metal levels.

It would be advantageous to employ a method of selectively forming barrier layers in an IC interconnect to prevent copper contamination, and selectively removing barrier layers to enhance conductivity between copper levels.

Accordingly, in an integrated circuit including a first metal horizontal level, a first barrier layer overlying the first metal level, a first dielectric interlevel overlying the first barrier layer, and a second barrier layer overlying the first dielectric interlevel, a method is provided for forming a low resistance interconnect between metal levels comprising the following steps:

a) etching selected overlying areas of the first barrier layer, the first dielectric interlevel, and the second barrier layer to form a via, exposing vertical sidewall surfaces of the first dielectric interlevel and selected areas of the first metal level;

b) conformally depositing a third barrier layer over the vertical sidewall surfaces of the first dielectric interlevel and the first metal level selected areas exposed in step a); and c) anisotropically etching, in the horizontal direction, to selectively remove the third barrier layer deposited over the first metal level selected areas, but not the vertical sidewall surfaces of the first dielectric interlevel. A via, having barrier surface sidewalls, is prepared to directly connect the first metal level with a subsequently deposited metal level.

Also provided, in an integrated circuit (IC), is a low resistance metal level via interconnection comprising a metal level, a dielectric interlevel overlying the first metal level, and a via through selected areas of the dielectric interlevel, exposing sidewall surfaces of the dielectric interlevel and selected areas of the metal level. The via interconnection further comprises a barrier layer over the sidewall surfaces of the dielectric interlevel, formed by conformally depositing barrier layer material over the sidewall surfaces of the dielectric interlevel and the metal level selected areas, and anisotropically etching, to selectively remove the barrier layer over the metal level selected areas. A via, having barrier surface sidewalls, is prepared to directly connect the metal level with a subsequently deposited metal level.

In an integrated circuit including a first metal horizontal level, a first barrier layer overlying of the first metal level, and a first dielectric interlevel overlying the first barrier layer, the first dielectric interlevel having a first thickness and a second thickness overlying the first thickness, a method is provided for forming a low resistance dual damascene interconnect between metal levels comprising the following steps:

a) etching selected areas of the first dielectric interlevel second thickness, forming a damascene interconnection trench, and exposing vertical sidewall surfaces of the first dielectric interlevel second thickness and selected horizontal surfaces of the first dielectric interlevel first thickness;

b) anisotropically depositing, in a horizontal direction, a second barrier layer over the first dielectric interlevel, to overlie the selected horizontal surfaces of the first dielectric interlevel first thickness exposed in step a), and minimally cover the vertical sidewall surfaces of the first dielectric interlevel second thickness;

c) etching selected overlying surfaces of the second barrier layer deposited in step b), selected horizontal surfaces of the first dielectric interlevel first thickness, and the first barrier level, exposing vertical sidewall surfaces of the first dielectric interlevel first thickness and selected areas of the first metal level, whereby a via is formed from the trench to the first metal level selected areas;

d) conformally depositing a third barrier layer over the vertical sidewall surfaces of the first dielectric interlevel second thickness exposed in step a), the second barrier layer deposited in step b), and the first metal level selected areas and vertical sidewall surfaces of the first dielectric interlevel first thickness exposed in step c); and e) anisotropically etching, in the horizontal direction, to selectively remove the third barrier layer overlying the first metal level selected areas, but not the third barrier layer overlying the vertical sidewall surfaces of the first dielectric interlevel first and second thicknesses. A damascene process via and trench, having barrier sidewall surfaces, are prepared to directly connect the first metal level with a subsequently deposited metal level.

Also provided, in an integrated circuit (IC), is a low resistance metal level dual damascene interconnection comprising a horizontal metal level, a dielectric interlevel overlying the metal level, the dielectric interlevel having a first thickness and a second thickness overlying the first thickness. The damascene interconnection further comprises a damascene interconnection trench formed through selected areas of the dielectric interlevel second thickness, exposing vertical sidewall surfaces of the dielectric interlevel second thickness and selected horizontal surfaces of the dielectric interlevel first thickness. In addition, the damascene interconnection comprises an insulating barrier layer formed by anisotropically deposition, in a horizontal direction, to overlie the selected horizontal surfaces of the dielectric interlevel first thickness.

The damascene interconnection comprises a via through selected overlying areas of the insulating barrier layer, and the first dielectric interlevel first thickness, exposing sidewall surfaces of the dielectric interlevel first thickness and selected areas of the metal level. Finally, the damascene interconnection comprises a conductive barrier layer formed by conformally depositing the conductive barrier layer material over the sidewall surfaces of the first dielectric interlevel first and second thicknesses, the selected horizontal surfaces of the dielectric interlevel first thickness, and the metal level selected areas. Then, the conductive barrier is anisotropically etched, in the horizontal direction, to selectively remove the conductive barrier layer deposited over the metal level selected areas. The damascene process via and trench, having conductive barrier surface sidewalls, are prepared to directly connect the metal level with a subsequently deposited metal level.

BRIEF DESCRIPTION OF THE DRAWINGS

FIGS. 4 through 9 are a more detailed depiction of the method of forming a completed low resistance metal level interconnection in an integrated circuit, presented in FIGS. 1–3.

DETAIL DESCRIPTION OF THE PREFERRED EMBODIMENT

Figure 1:
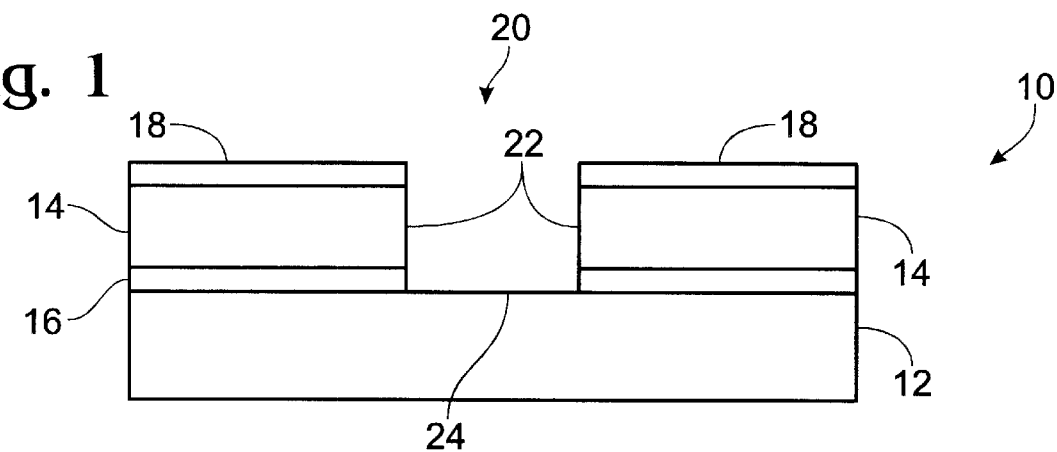
FIGS. 1 through 3 illustrate steps in a method of forming a completed low resistance metal level via interconnection in an integrated circuit.
Figure 2:
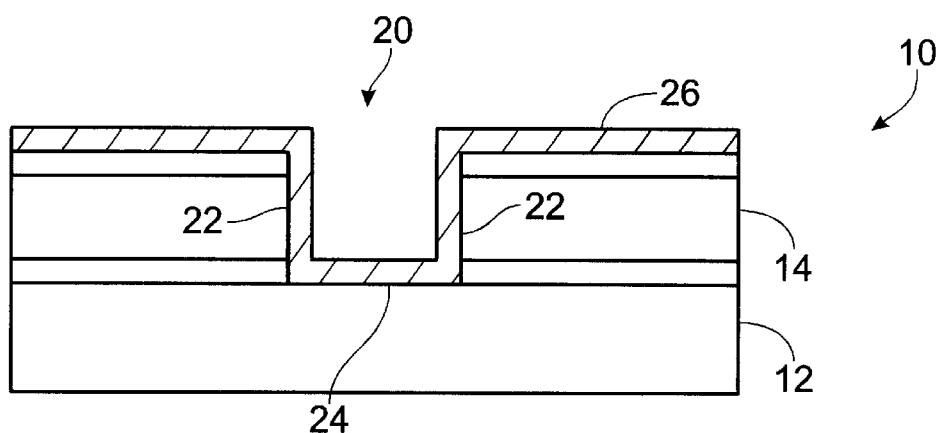
Figure 3:
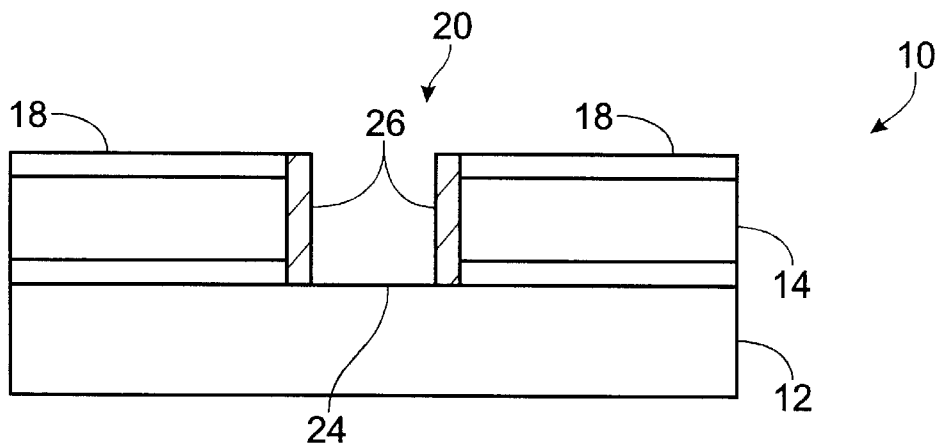

FIGS. 1 through 3 illustrate steps in a method of forming a completed low resistance metal level via interconnection in an integrated circuit. FIG. 1 is a partial cross-sectional view of IC 10. IC 10 comprises a metal level 12 and a dielectric interlevel 14 overlying first metal level 12. In some aspects of the invention, a non-conductive barrier layer 16 separates dielectric interlevel 14 from metal level 12. In some aspects of the invention, a non-conductive barrier layer 18 overlies dielectric interlevel 14. IC 10 also comprises a via 20 through selected areas of dielectric interlevel 14 exposing sidewall surfaces 22 of dielectric interlevel 14 and selected areas 24 of metal level 12.

FIG. 2 is a partial cross-sectional view of IC 10 depicting a barrier layer 26 over sidewall surfaces 22 of dielectric interlevel 14 formed by conformally depositing conductive and non-conductive barrier layer materials over sidewall surfaces 22 of dielectric interlevel 14 and metal level selected areas 24.

FIG. 3 is a partial cross-sectional view of IC 10 depicting the anisotropic etching of barrier layer 26, to selectively remove barrier layer 26 over metal level selected areas 24. In the process, barrier layer 26 overlying barrier layer 18 has also been removed. Via 20 now has barrier surface sidewalls 26, and is prepared to directly connect metal level 12 with a subsequently deposited metal level (not shown).

FIGS. 4 through 9 are a more detailed depiction of the method of forming a completed low resistance metal level interconnection in an integrated circuit, presented in FIGS. 1–3. FIG. 4 is a partial cross-sectional view of integrated circuit 30 comprising a first metal horizontal level 32. The plane of metal level 32 is designated as horizontal is for the purposes of a clear description of the invention, and is arbitrary. Alternately, first metal level 32 is vertical, or the view of frame of reference is rotated 90degrees. A first barrier layer 34 overlies first metal level 32, and a first dielectric interlevel 36 overlies first barrier layer 34. A second barrier layer 38 overlies first dielectric interlevel 36.

FIG. 5 is a partial cross-sectional view of IC 30 depicting a first via 40 through selected overlying areas of first barrier layer 34, first dielectric interlevel 36, and second barrier layer 38, exposing vertical sidewall surfaces 42 of first dielectric interlevel 36 and selected areas 44 of first metal level 32. Typically, via 40 is formed by depositing a layer of photoresist 46, and patterning photoresist 46 to form a gap where via 40 is to be formed. First barrier layer 34, first dielectric interlevel 36, and second barrier layer 38 are plasma etched through the gap in photoresist 46 to form via 40. After the formation of via 40, photoresist 46 is removed.

FIG. 6 is a partial cross-sectional view of IC 30 depicting a third barrier layer 46 formed by conformally depositing third barrier layer 46 over vertical sidewall surfaces 42 of first dielectric interlevel 36 and first metal level selected areas 44.

Figure 7:
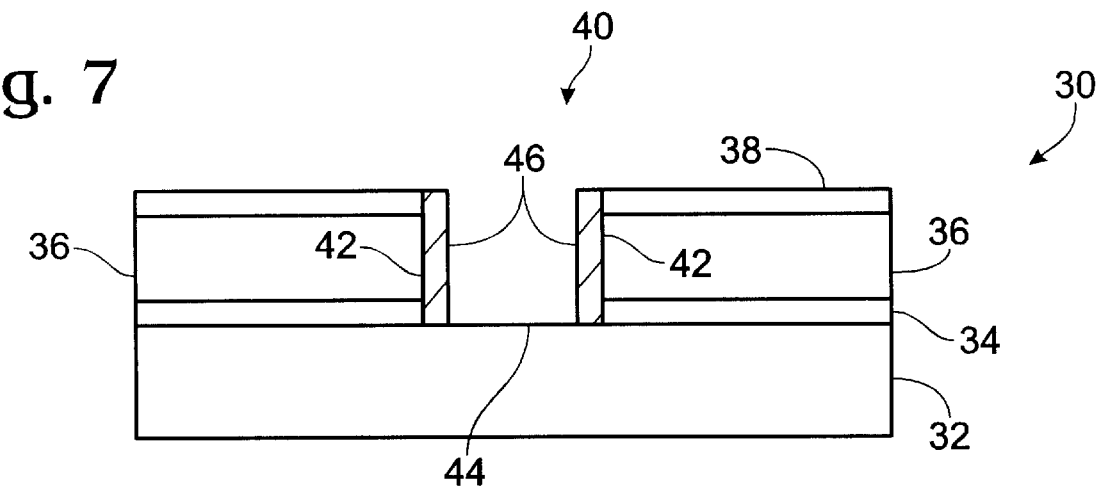

FIG. 7 is a partial cross-sectional view of IC 30 depicting third barrier layer 46 after anisotropically etching, in the horizontal direction, to selectively remove third barrier layer 46 over first metal level selected areas 44. In the etching process, third barrier layer 46 overlying second barrier layer 38 is usually removed. First via 40, having barrier sidewall surfaces 46, is prepared to directly connect first metal level 32 with a subsequently deposited metal level (not shown).

Figure 8:
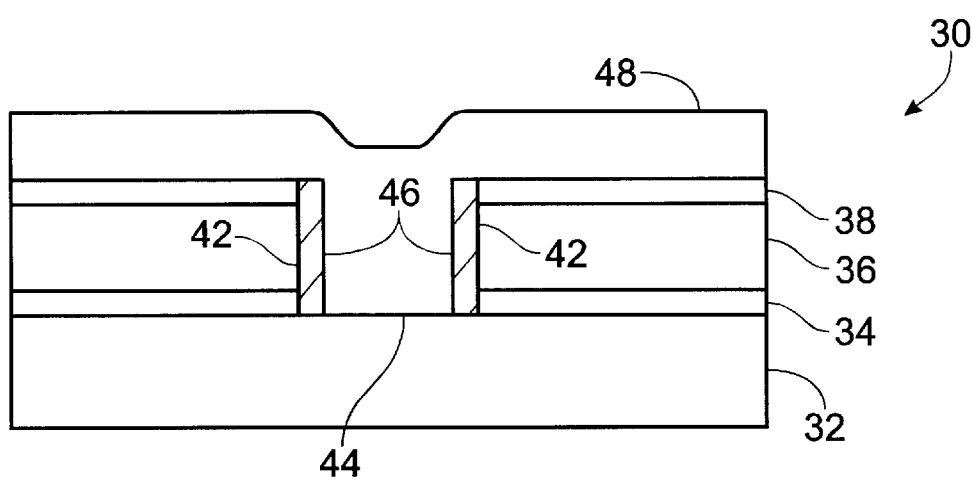

FIG. 8 is a partial cross-sectional view of IC 30 further comprising a second metal level 48 overlying second barrier layer 38, and filling first via 40 to connect with first metal level selected areas 44. A minimum resistance connection, without an intervening barrier layer, is made between metal levels.

Figure 9:
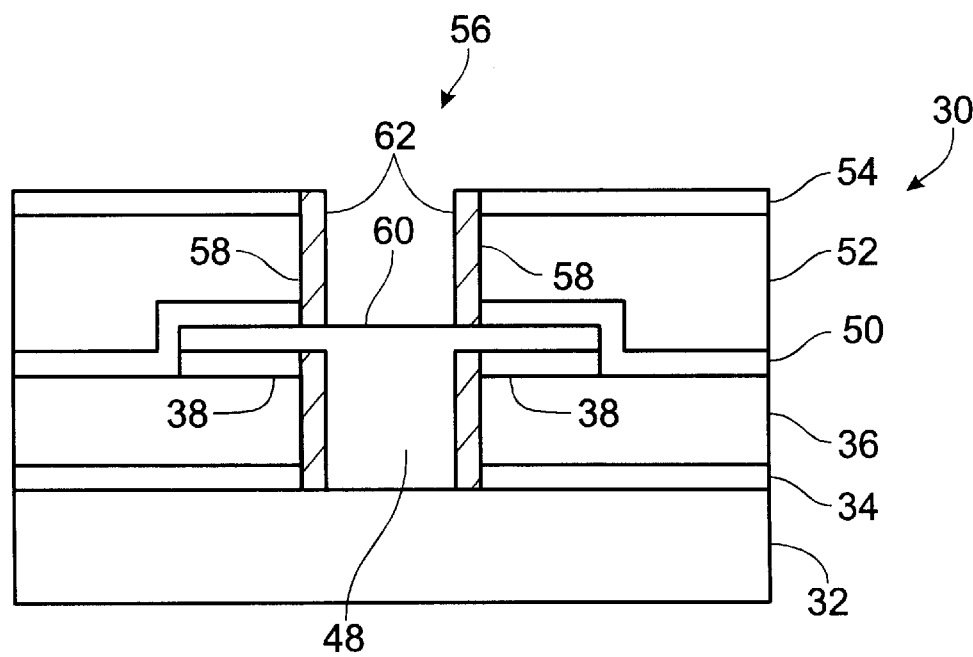

FIG. 9 is a partial cross-sectional view of IC 30 wherein second metal level 48 is selectively etched to from an interconnect, or interconnect layer. In some aspects of the invention, portions of second barrier layer 38 are removed when second metal level 48 is etched. Then, second barrier layer 38 remains under the areas of second metal level 48 not etched, as shown in FIG. 9. IC 30 further comprises a fourth barrier layer 50 overlying second metal level 48, and first dielectric 36 where second barrier layer 38 is etched away. A second dielectric interlevel 52 overlies fourth barrier layer 50. After the deposition of second dielectric interlevel 52, the surface is second dielectric interlevel 52 is uneven, as its surface contour follows the different horizontal planes of second metal level 48 and first dielectric interlevel 36. In some aspects of the invention, a chemical mechanical polish is performed on second dielectric interlevel 52 to form a substantially flat surface. A fifth barrier layer 54 overlies second dielectric interlevel 52. IC 30 also comprises a second via 56 through selected overlying areas of fourth barrier layer 50, second dielectric interlevel 52, and fifth barrier layer 54, exposing vertical sidewall surfaces 58 of second dielectric interlevel 52 and selected areas 60 of second metal level 48. A sixth barrier layer 62 is formed by conformally depositing sixth barrier layer 62 over vertical sidewall surfaces 58 of second dielectric interlevel 52 and second metal level selected areas 60. Sixth barrier layer 62 is anisotropically etched, in the horizontal direction, to selectively remove sixth barrier level deposited over second metal level selected areas 60, and over the horizontal surfaces of fifth barrier layer 54. Second via 56, having barrier surface sidewalls 58, is prepared to directly connect second metal level 48 with a subsequently deposited metal level (not shown).

FIGS. 4 through 9 depict the interconnection of two metal levels and the preparation for connection to a third metal level. In the same manner as depicted in FIGS. 4 through 9, and described above, interconnections can be made to even a larger number of metal levels in an integrated circuit. The various interconnection vias and trenches need not be aligned as shown in FIGS. 4–9, and the via diameters and trench shapes are variable.

First barrier layer material 34 and second barrier layer material 38 are non-conductive, and third barrier layer material 46 is selected from the group consisting of conductive and non-conductive materials. Typically, third barrier layer 46 is conductive. When third barrier layer 46 is conductive, then first metal level 32 and second metal level 48 need not necessarily be in contact to make an electrical connection. The electrical connection between first metal level 32 and second metal level 48 is then made through third barrier layer 46. That is, third barrier layer 46 ensures an electrical connection between metal levels when second metal level 48 incompletely fills first via 40. However, an indirect electrical connection, through barrier layer 46, is not as conductive as a direct copper-to-copper connection.

The non-conductive barrier layer material is selected from the group consisting of $Si_3N_4$, and TiO. The conductive barrier layer material is selected from the group consisting of refractory metals and refractory metal compounds including TiN, WN, and TaN. Typically first metal level 32, as well as second metal level 38, are copper.

Figure 10:
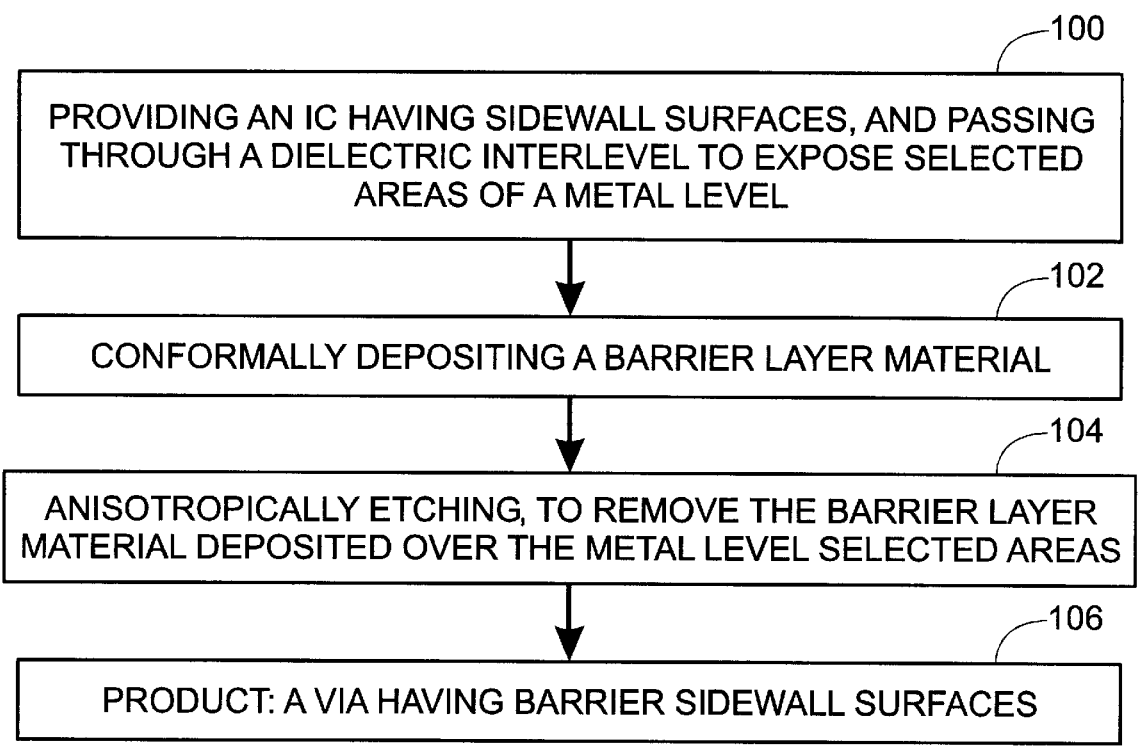
FIG. 10 is a flow chart illustrating steps in a method of forming a low resistance via interconnect between metal levels.

FIG. 10 is a flow chart illustrating steps in a method of forming a low resistance via interconnect between metal levels. Step 100 provides an integrated circuit via having sidewall surfaces, and passing through a dielectric interlevel to expose selected areas of a metal level. Step 102 conformally deposits a barrier layer material overlying the via to form a barrier layer overlying the dielectric interlevel sidewall surfaces and metal level selected areas. Step 104 anisotropically etches to selectively remove the barrier layer deposited over the metal level selected areas, but not the dielectric interlevel sidewall surfaces. Step 106 is a product, a via having barrier surface sidewalls prepared to directly connect the metal level with a subsequently deposited metal level.

Figure 11:
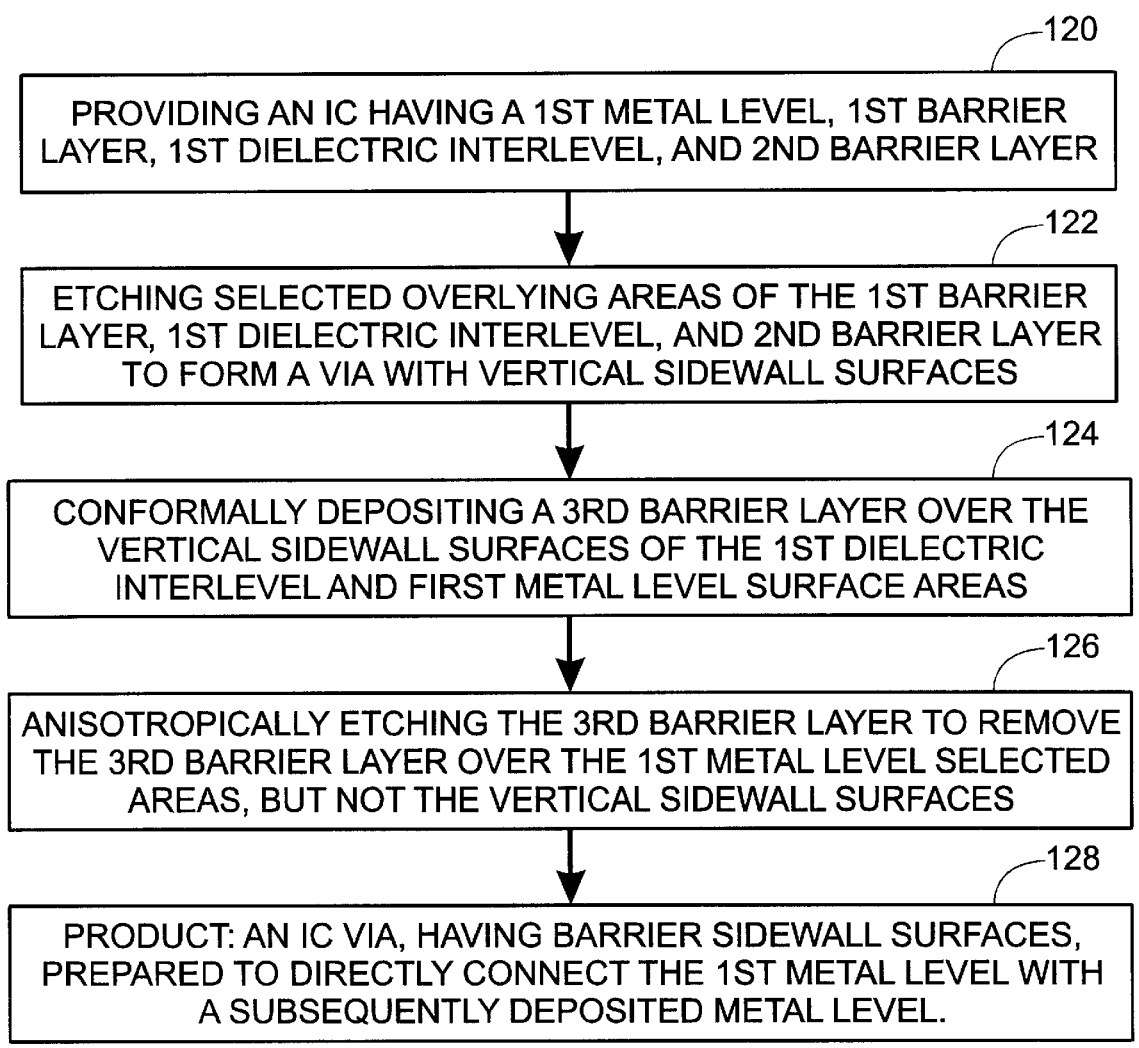
FIG. 11 is a more detailed version of the flow chart in FIG. 10 illustrating a method of forming a low resistance interconnect between metal levels.

FIG. 11 is a more detailed version of the flow chart in FIG. 10 illustrating a method of forming a low resistance interconnect between metal levels. Step 120 provides an integrated circuit including a first metal horizontal level, a first barrier layer overlying the first metal level, a first dielectric interlevel overlying the first barrier layer, and a second barrier layer overlying the first dielectric interlevel. Step 122 etches selected overlying areas of a first barrier layer, the first dielectric interlevel, and the second barrier layer to form a via, exposing vertical sidewall surfaces of the first dielectric interlevel and selected areas of the first metal level. Step 124 conformally deposits a third barrier layer over the vertical sidewall surfaces of the first dielectric interlevel and the first metal level selected areas exposed in Step 122. Step 126 anisotropically etches, in the horizontal direction, to selectively remove the third barrier layer deposited over the first metal level selected areas, but not the vertical sidewall surfaces of the first dielectric interlevel. Step 128 is a product, an IC via, having barrier surface sidewalls, prepared to directly connect the first metal level with a subsequently deposited metal level.

In one aspect of the invention, a further step, following step 126, deposits a second metal level overlying the second barrier layer, filling the via formed in Step 122, to connect with the first metal level. A minimum resistance connection, without intervening barrier layers, is made between metal levels when the two metal levels are directed connected.

Further steps selectively etch the second metal level to form an interconnect, or interconnect layer. A fourth barrier layer is deposited overlying the second metal level. When the selective etch removes the second barrier layer, the fourth barrier layer is deposited on the exposed first dielectric interlevel. A second dielectric interlevel is deposited overlying the fourth barrier layer. Typically, a CMP is performed on the second dielectric interlevel to from a flat horizontal surface. A fifth barrier layer is deposited overlying the second dielectric interlevel. A following step repeats the steps of the method, described above with regard to FIG. 11, forming a low resistance connection between the second metal level and a subsequently deposited third metal level. In this manner, a plurality of metal levels in the IC are interconnected.

The first and second barrier layer materials are non-conductive and the third barrier layer material is selected from the group of conductive and non-conductive materials. The non-conductive barrier layer material is selected from the group consisting of $Si_3N_4$ and TiO. The conductive barrier layer material is selected from the group consisting of refractory metals and refractory metal compounds including TiN, WN, and TaN. Typically, the first and second metal levels are copper.

Figure 12:
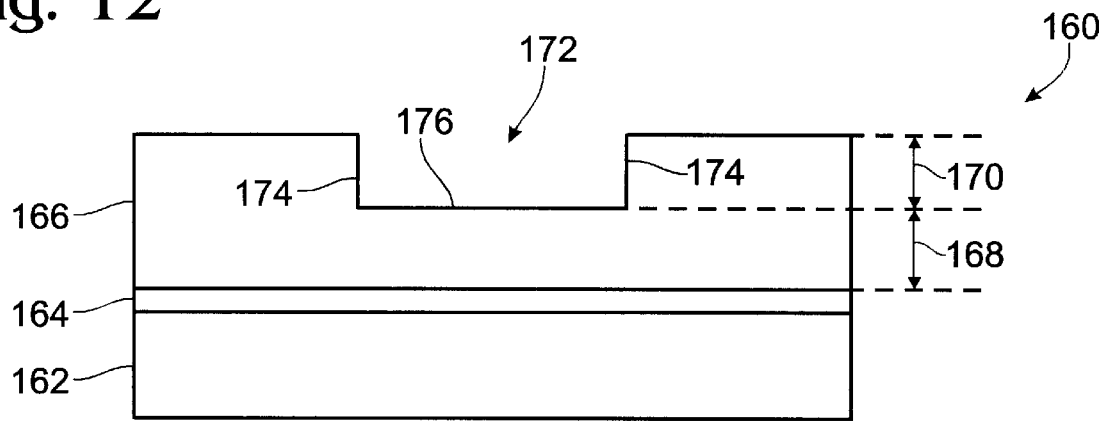
FIGS. 12 through 18 illustrate steps in a method of forming a completed low resistance metal level dual damascene interconnection in an integrated circuit.

FIGS. 12 through 18 illustrate steps in a method of forming a completed a low resistance metal level dual damascene interconnection in an integrated circuit. FIG. 12 is a partial cross-sectional view of an IC 160 comprising a first horizontal metal level 162, a first barrier layer 164 overlying first metal level 162, and a first dielectric interlevel 166 overlying first barrier layer 164 and first metal level 162. The term horizontal is presented for the purposes of clarity, and is arbitrary. First dielectric interlevel 166 has a first thickness 168 and a second thickness 170 overlying first thickness 168.

IC 160 comprises a first damascene interconnection trench 172 formed through selected areas of first dielectric interlevel second thickness 170, exposing vertical sidewall surfaces 174 of first dielectric interlevel second thickness 170 and selected horizontal surfaces 176 of first dielectric interlevel first thickness 168. In some aspects of the invention, such as when first metal level 162 is not copper, first barrier layer 164 is not included. Barrier layer 164 is not necessary when first metal level 162 is a metal that does not contaminate surrounding substrate areas. When first barrier layer 164 is not included, the first metal level material is selected from the group consisting of aluminum, aluminum-copper alloys, and tungsten.

Figure 13:
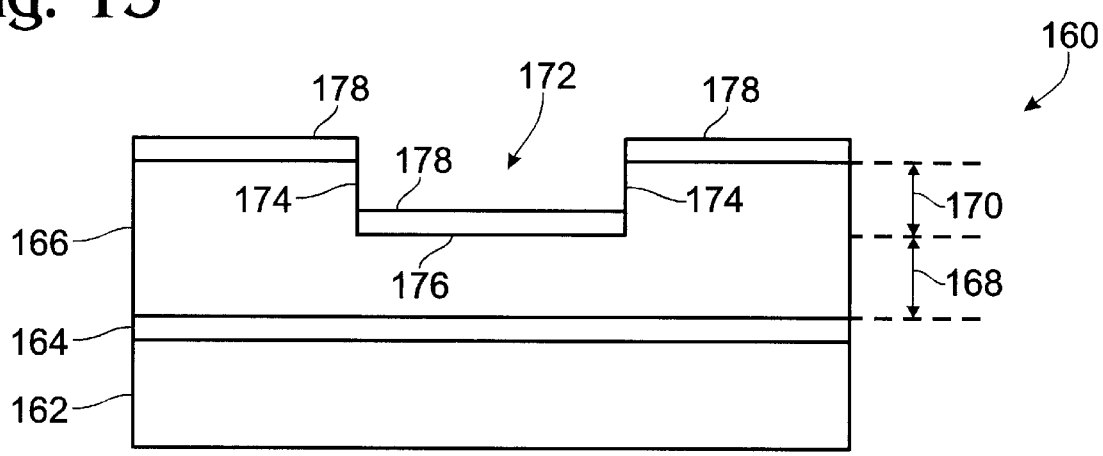

FIG. 13 is a partial cross-sectional view of IC 160 further comprising a second barrier layer 178 formed by anisotropic deposition, in the horizontal direction, to overlie selected horizontal surfaces 176 of first dielectric first thickness 168, and minimally covering vertical sidewall surfaces 174 of first dielectric interlevel second thickness 170. Ideally, vertical sidewall surfaces 174 do not collect a deposition of any of second barrier layer 178. However, in many anisotropic deposition process at least some material is deposited on vertical surfaces. Typically, second barrier layer 178 is an electrical insulator.

Figure 14:
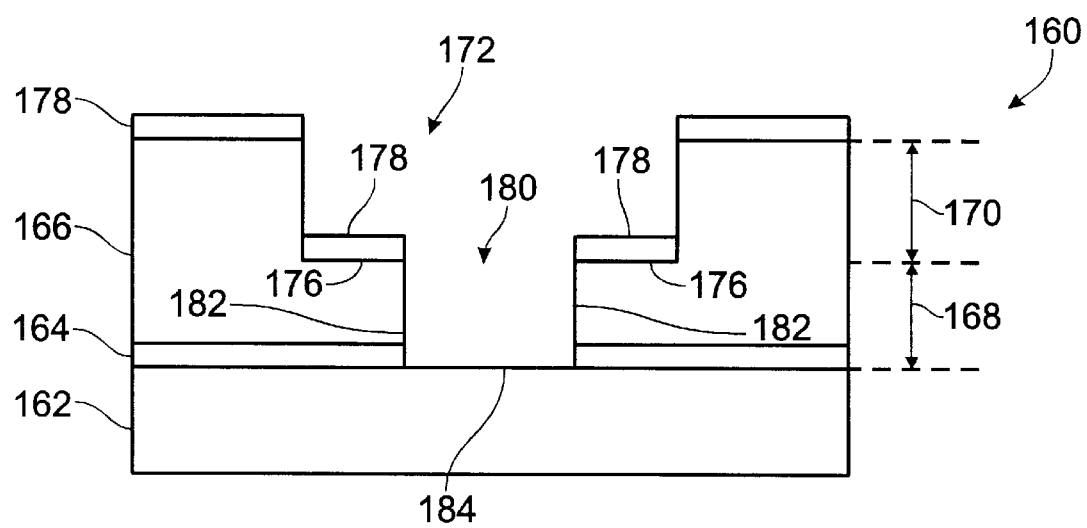

FIG. 14 is a partial cross-sectional view of IC 160 depicting a first damascene via 180 formed through selected overlying areas of second barrier layer 178, and first dielectric interlevel first thickness 168, and first barrier layer 164, exposing vertical sidewall surfaces 182 of first dielectric interlevel first thickness 168 and selected areas 184 of first metal level 162.

Figure 15:
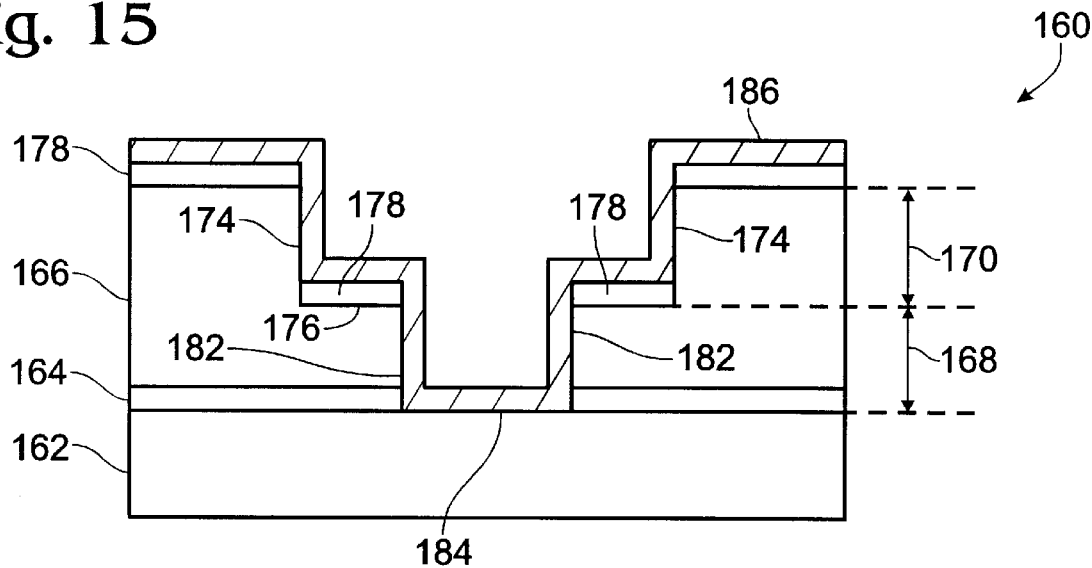

FIG. 15 is a partial cross-sectional view of IC 160 depicting a third barrier layer 186 formed by conformally depositing third barrier layer 186 over vertical sidewall surfaces 174 and 182 of first dielectric interlevel first thickness 168 and first dielectric interlevel second thickness 170. Selected horizontal surfaces 176 of first dielectric interlevel first thickness 168, and second barrier layer 178 overlying horizontal surfaces 176, are conformally coated by third barrier layer 186 in this process. In addition, third barrier layer 186 is deposited over selected areas 184 of first metal level 162. Third barrier layer 186 is typically conductive.

Figure 16:
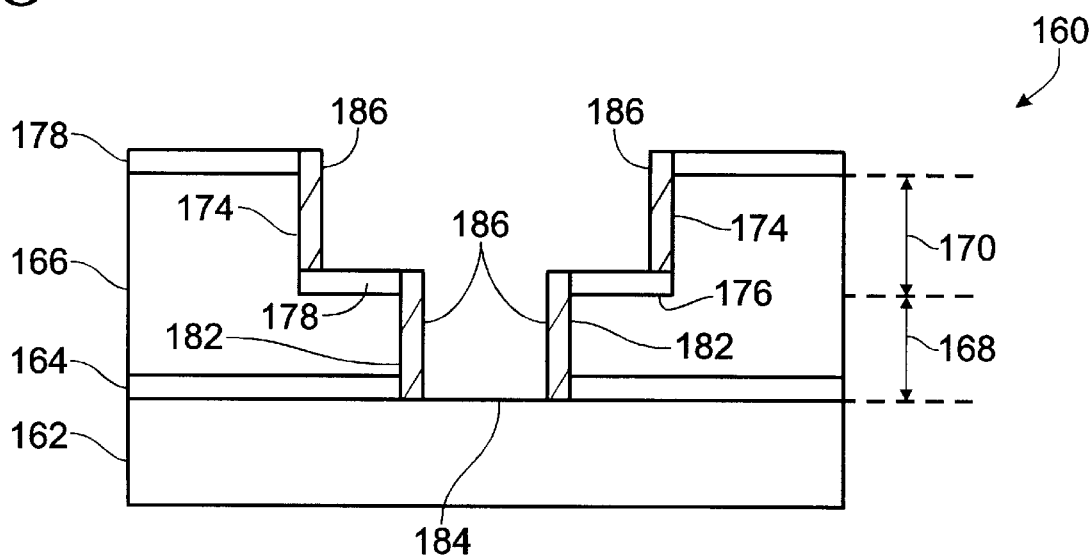

FIG. 16 is a partial cross-sectional view of IC 160 depicting third barrier 186 after anisotropically etching, in the horizontal direction, to selectively remove third barrier layer 186 deposited over first metal level selected areas 184. In the same process, third barrier layer 186 is also removed from second barrier layer 178 overlying selected horizontal surfaces 176 of first dielectric interlevel first thickness 168. Damascene process first via 180 and first trench 172 now have barrier surface sidewalls 186, and are prepared to directly connect first metal level 162 with a subsequently deposited metal level (not shown).

Figure 17:
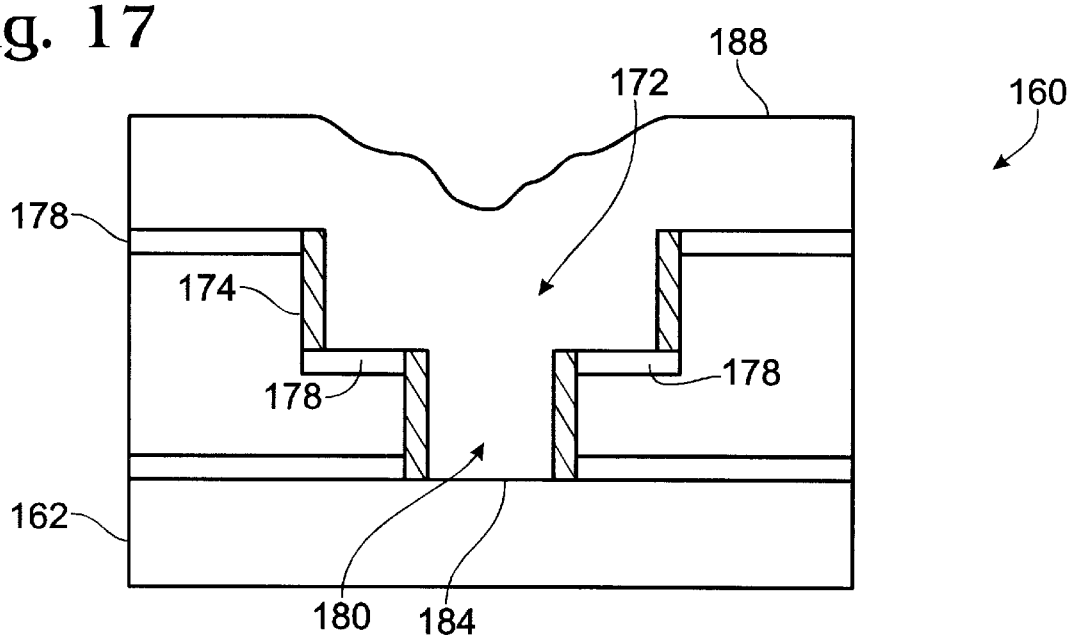

FIG. 17 is a partial cross-sectional view of IC 160 comprising a second metal level 188 overlying first dielectric interlevel 166, filling first via 180 and first trench 172 to connect with first metal level selected area 184. A minimum resistance connection, without an intervening barrier layer, is made between metal levels 162 and 188.

Figure 18:
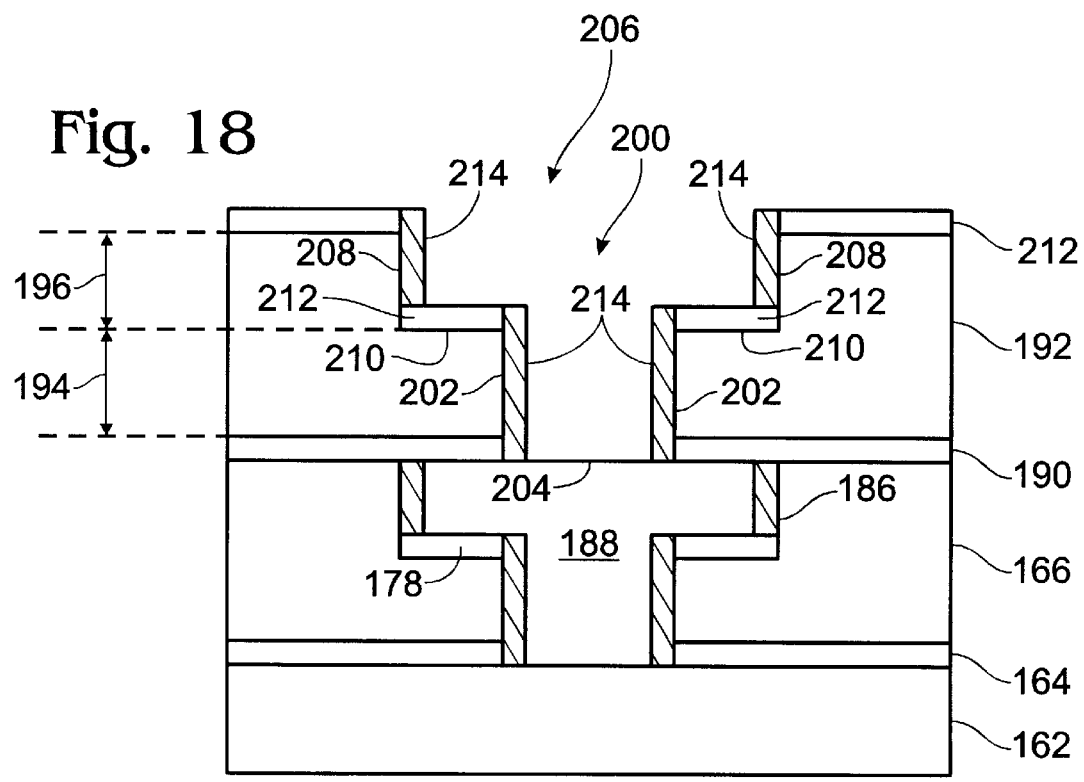

FIG. 18 is a partial cross-sectional view of IC 160 wherein a CMP is performed on second metal level 188. In some aspects of the invention, the CMP process also removes second barrier layer 178 overlying first dielectric interlevel 166. IC 160 further comprises a fourth barrier layer 190 overlying second metal level 188, and a second dielectric interlevel 192 overlying fourth barrier layer 190. Second dielectric interlevel 192 has a first thickness 194 and a second thickness 196 overlying first thickness 194. A second damascene via 200 through selected overlying areas of fourth barrier layer 190 and second dielectric interlevel first thickness 194 exposes vertical sidewall surfaces 202 of second dielectric interlevel first thickness 194 and selected areas 204 of second metal level 188.

IC 160 further comprises a second damascene trench 206 overlying second via 200, formed through selected areas of second dielectric interlevel second thickness 196. Second damascene trench 206 exposes vertical sidewall surfaces 208 of second dielectric interlevel second thickness 196 and selected horizontal surfaces 210 of second dielectric interlevel first thickness 194.

IC 160 further comprises a fifth barrier layer 212 formed before second via 200 is etched, by anisotropic deposition, in a horizontal direction, to overlie selected horizontal surfaces 210 of second dielectric interlevel first thickness 194, and minimally cover vertical sidewall surfaces 208 of second dielectric interlevel second thickness 196.

IC 160 also comprises an sixth barrier layer 214 formed by conformally depositing sixth barrier layer 214 over vertical sidewall surfaces 202 of first dielectric interlevel first thickness 194 and vertical sidewall surfaces 208 of second dielectric interlevel second thickness 196, and second metal level selected areas 204. Typically in this process, fifth barrier layer 212, covering selected horizontal surfaces 210 of second dielectric interlevel first thickness 194, is also conformally coated with sixth barrier layer 214. Sixth barrier layer 214 is then anisotropically etched, in the horizontal direction, to selectively remove sixth barrier layer 214 deposited over second metal level selected areas 204. In this etching process, sixth barrier layer 214 is removed from fifth barrier layer 212 covering selected horizontal surfaces 210 of second dielectric interlevel first thickness 194, and fifth barrier layer 212 overlying second dielectric interlevel 192. Second via 200 and second trench 206 have barrier sidewall surfaces 214, and are prepared to directly connect second metal level 188 with a subsequently deposited metal level (not shown).

In some aspects of the invention, first barrier layer 164 and second barrier layer 178 materials are non-conductive, and third barrier layer 186 material is selected from the group consisting of conductive and non-conductive materials. Non-conductive barrier layer materials are selected from the group consisting of $Si_3N_4$, and TiO. Conductive barrier layer material is selected from the group consisting of refractory materials and refractory metal compounds including TiN, WN, and TaN. First metal level 162 and second metal level 188 are typically copper.

Figure 19:
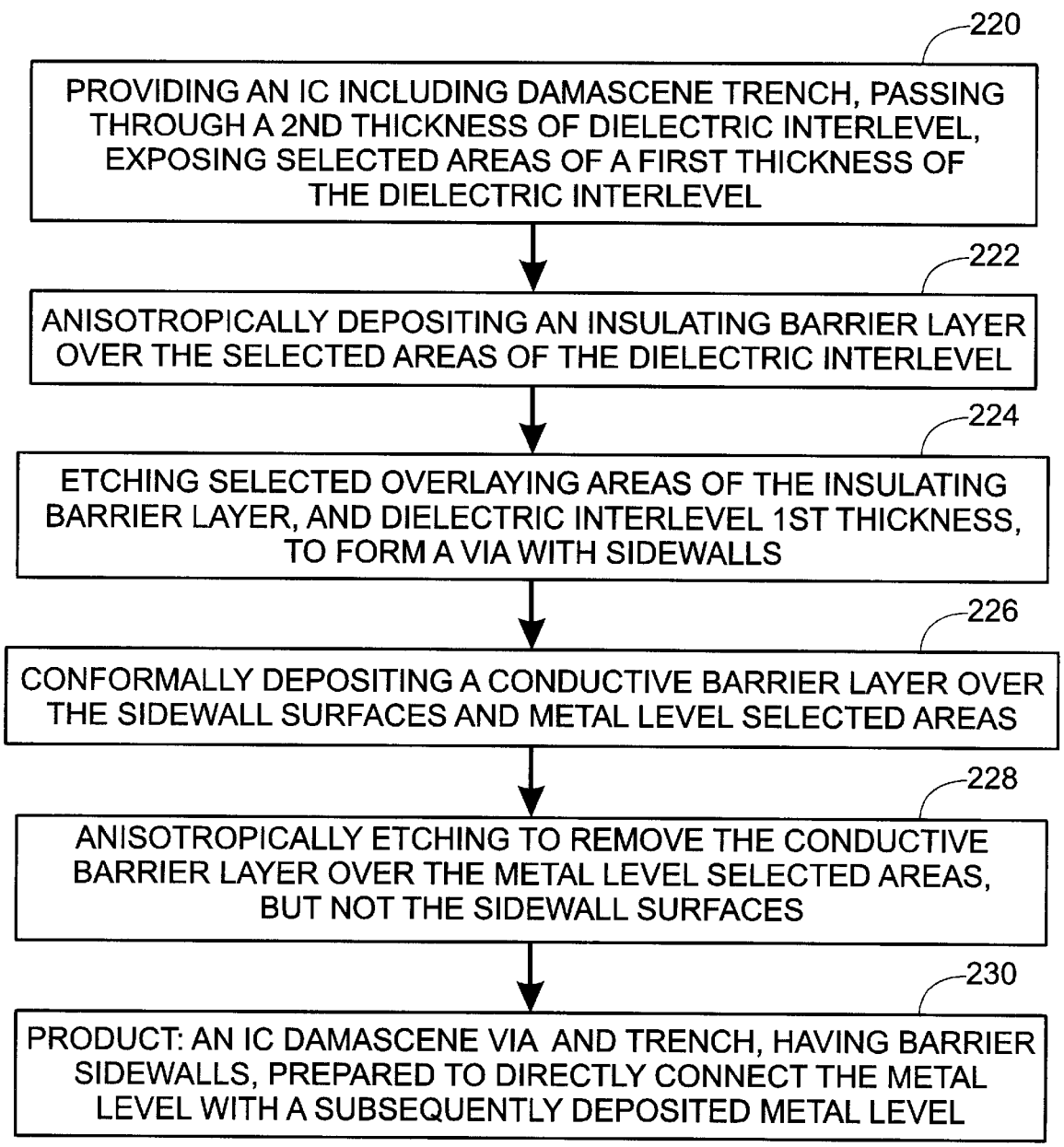
FIG. 19 is a flow chart illustrating steps in a method of forming a low resistance interconnect between metal levels using a damascene process.

FIG. 19 is a flow chart illustrating steps in a method of forming a low resistance interconnect between metal levels using a damascene process. Step 220 provides an IC including a damascene interconnection trench, having sidewalls and passing through a second thickness of dielectric interlevel, exposing selected areas of a first thickness of dielectric interlevel. The dielectric interlevel overlies a metal level. Step 222 anisotropically deposits an insulating barrier layer material overlying the trench, forming an insulating barrier layer overlying the selected areas of the dielectric interlevel first thickness. Step 224 etches selected overlying areas of the insulating barrier layer and the dielectric interlevel first thickness, exposing sidewall surfaces of the dielectric interlevel first thickness and selected areas of a metal level, whereby a via is formed from the trench to the metal level selected areas. In some aspects of the invention, Step 224 includes exposing selected areas of a metal level material selected from the group consisting of aluminum, aluminum-copper alloys, and tungsten. Step 226 conformally deposits a conductive barrier layer material overlying the trench and via, forming a conductive barrier layer on the sidewall surfaces of the dielectric interlevel first and second thicknesses and the metal level selected areas. Step 228 anisotropically etches to selectively remove the conductive barrier layer overlying the metal level selected areas, but not the conductive barrier layer overlying the sidewall surfaces of the first dielectric interlevel first and second thicknesses. Step 230 is a product a damascene IC process via and trench, having barrier sidewall surfaces, prepared to directly connect the metal level with a subsequently deposited copper metal level.

Figure 20:
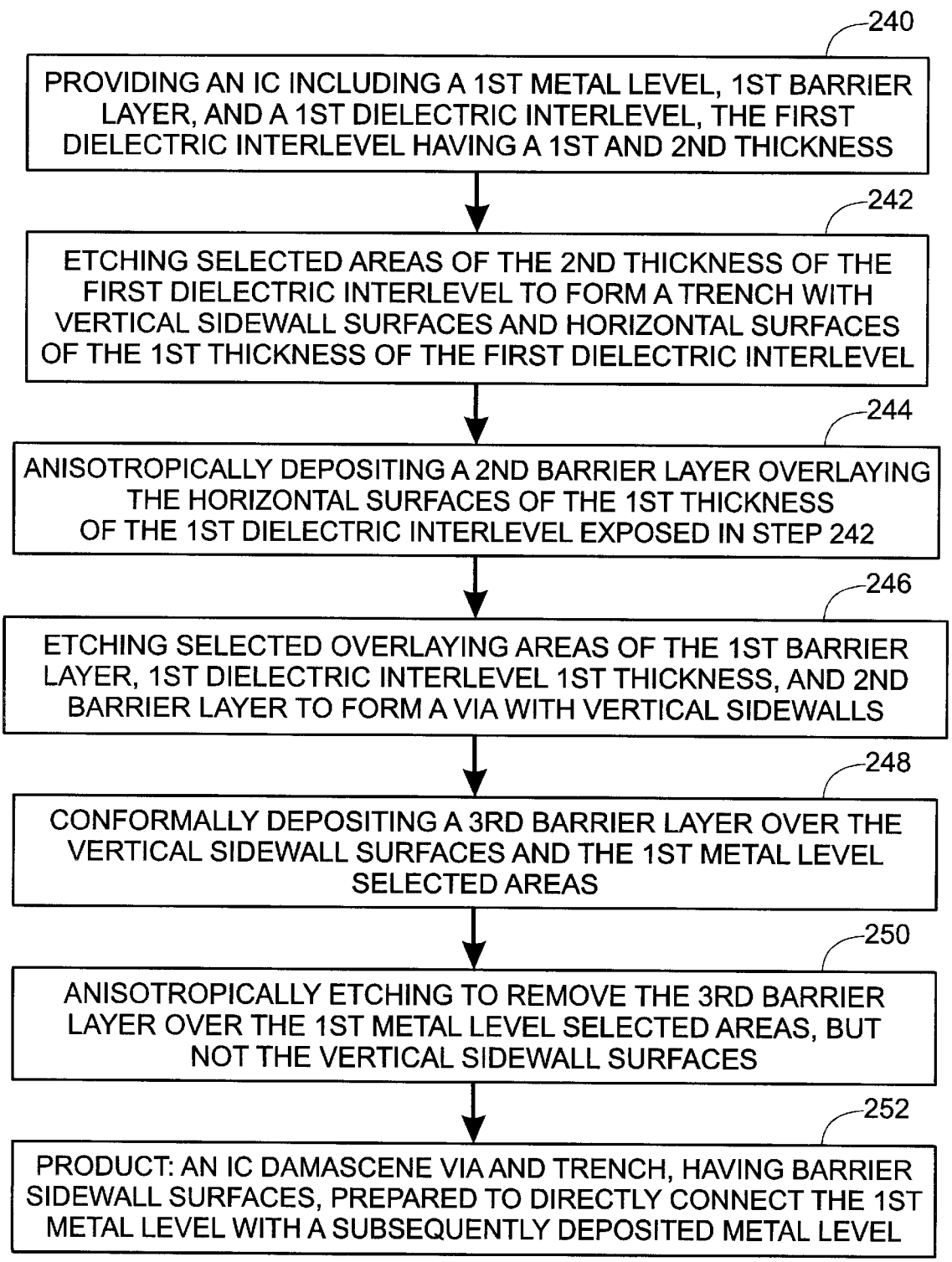
FIG. 20 is a more detailed version of the flow chart of FIG. 19 illustrating steps in a method of forming a low resistance dual damascene interconnect between metal levels.

FIG. 20 is a more detailed version of the flow chart of FIG. 19 illustrating steps in a method of forming a low resistance dual damascene interconnect between metal levels. Step 240 provides an integrated circuit including a first metal horizontal level, a first barrier layer overlying the first metal level, and a first dielectric interlevel overlying the first barrier layer, the first dielectric interlevel having a first thickness and a second thickness overlying the first thickness. Step 242 etches selected areas of the first dielectric interlevel second thickness, forming a damascene interconnection trench, and exposing vertical sidewall surfaces of the first dielectric interlevel second thickness and selected horizontal surfaces of the first dielectric interlevel first thickness. Step 244 anisotropically deposits, in a horizontal direction, a second barrier layer over the first dielectric interlevel, to overlie the selected horizontal surfaces of the first dielectric interlevel first thickness exposed in step 242, and minimally covering the vertical sidewall surfaces of the first dielectric interlevel second thickness. Step 246 etches selected overlying areas of the second barrier layer deposited in step 244, selected horizontal surfaces of the first dielectric interlevel first thickness, and the first barrier layer, exposing vertical sidewall surfaces of the first dielectric interlevel first thickness and selected areas of the first metal level, whereby a via is formed from the trench to the first metal level selected areas.

Step 248 conformally deposits a third barrier layer over the vertical sidewall surfaces of the first dielectric interlevel second thickness exposed in step 242, the second barrier layer deposited in step 244, and the first metal level selected areas and vertical sidewall surfaces of the first dielectric interlevel first thickness exposed in step 246. Step 250 anisotropically etches, in the horizontal direction, to selectively remove the third barrier layer overlying the first metal level selected areas, but not the third barrier layer overlying the vertical sidewall surfaces of the first dielectric interlevel first and second thicknesses. Step 252 is a product, an IC damascene process via and trench, having barrier surface sidewalls, prepared to directly connect the first metal level with a subsequently deposited metal level.

Some aspects of the invention include a further step, following step 250, of depositing a second metal level overlying the second barrier layer, filling the trench formed in step 242 and the via formed in step 244, to connect with the first metal level selected areas. A minimum resistance connection, without an intervening barrier layer, is made between metal levels. Further steps perform a chemical mechanical polish of the second metal level, and deposit a fourth barrier layer overlying the second metal level, and a second dielectric interlevel overlying the fourth barrier layer. A following step repeats the steps of the method, described above and illustrated in FIG. 20, to form a low resistance connection between the second metal level and a subsequently deposited third metal level, whereby a plurality of metal levels in the IC are interconnected.

The first and second barrier layer materials, and the corresponding barrier layer materials of interconnects on other IC levels, are non-conductive. The third barrier layer material, and the corresponding barrier layer material of other interconnect levels in the IC, is selected from the group consisting of conductive and non-conductive materials. The non-conductive barrier layer material is selected from the group consisting of $Si_3N_4$ and TiO. The conductive barrier layer material is selected from the group consisting of refractory metals, and refractory metal compounds including TiN, WN, and TaN. The first and second metal levels are typically copper.

The present invention discloses two methods for forming novel interconnections between copper metal levels in an IC. The primary advantage offered by these methods is the elimination of the conductive barrier layer between copper interlevels which is typical in most copper IC structures. The direct contact of copper levels makes for an interconnection that is many times more conductive than an interconnection using a barrier layer. The method involves relatively simple IC processes of conformal deposition and anisotropic etching. Other embodiments and variations of the invention will occur to those skilled in the art.

What is claimed is:

1. In an integrated circuit (IC) via having sidewall surfaces and passing through a dielectric interlevel to expose selected areas of a metal level, a method for forming sidewall barriers lining a low resistance via interconnect without an intervening barrier layer between metal levels comprising the following steps:

a) conformally depositing a barrier layer material overlying the via to form a barrier layer overlying the dielectric interlevel sidewall surfaces and metal level selected areas; and b) anisotropically etching to selectively remove the barrier layer deposited over the metal level selected areas, exposing the metal level selected areas, but not the dielectric interlevel sidewall surfaces, whereby a via, having barrier surface sidewalls, is prepared to directly connect the metal level with a subsequently deposited metal level for improved electrical conductivity.

2. In an integrated circuit (IC) including a first metal horizontal level, a first barrier layer overlying the first metal level, a first dielectric interlevel overlying the first barrier layer, and a second barrier layer overlying the first dielectric interlevel, a method for forming sidewall barriers lining a low resistance interconnect without an intervening barrier layer between metal levels comprising the following steps:

a) etching selected overlying areas of the first barrier layer, the first dielectric interlevel, and the second barrier layer to form a via, exposing vertical sidewall surfaces of the first dielectric interlevel and selected areas of the first metal level;

b) conformally depositing a third barrier layer over the vertical sidewall surfaces of the first dielectric interlevel and the first metal level selected areas exposed in step a); and c) anisotropically etching, in the horizontal direction, to selectively remove the third barrier layer deposited over the first metal level selected areas, exposing the first metal level selected areas, but not the vertical sidewall surfaces of the first dielectric interlevel, whereby a via, having barrier surface sidewalls, is prepared to directly connect the first metal level with a subsequently deposited metal level for improved electrical conductivity.

3. A method as in claim 2 comprising the further step, following step c), of:

d) depositing a second metal level overlying the second barrier layer, filling the via formed in step a), to connect with the first metal level, whereby a minimum resistance connection, without an intervening barrier layer, is made between the metal levels.

4. A method as in claim 3 comprising the further step, following step d), of:

e) selectively etching the second metal level, forming an interconnect;

f) depositing a fourth barrier layer overlying the second metal level, and a second dielectric interlevel overlying the fourth barrier layer;

g) performing a chemical mechanical polish of the second dielectric interlevel, and depositing a fifth barrier layer overlying the second dielectric interlevel; and h) repeating the steps of the method described in steps a) through d) to form a low resistance connection between the second metal level and a subsequently deposited third metal level, whereby a plurality of metal levels in the IC are interconnected.

5. A method as in claim 2 in which the first and second barrier layer materials are non-conductive, and the third barrier layer material is selected from the group consisting of conductive and nonconductive materials.

6. method as in claim 5 in which the non-conductive barrier layer material is selected from the group consisting of $Si_3N_4$ and TiO.

7. A method as in claim 5 in which the conductive barrier layer material is selected from the group consisting of refractory metals and refractory metal compounds including TiN, WN, and TaN.

8. A method as in claim 2 in which the first metal level is copper.

9. A method as in claim 3 in which the first and second metal levels are copper.

10. In an integrated circuit (IC) damascene interconnection trench, having sidewall surfaces and passing through a second thickness of the dielectric interlevel, exposing selected areas of a first thickness of the dielectric interlevel overlying a metal level, a method for forming a dual damascene interconnect with sidewall barriers lining the trench and via, without forming an intervening barrier layer between the metal level and the dual damascene interconnect, the method comprising the following steps:

a) anisotropically depositing an insulating barrier layer material overlying the trench, forming an insulating barrier layer overlying the selected areas of the dielectric interlevel first thickness where a via is subsequently formed;

b) etching selected overlying areas of the insulating barrier layer and the underlying dielectric interlevel first thickness, exposing sidewall surfaces of the dielectric interlevel first thickness and selected areas of the metal level, whereby a via is formed from the trench to the metal level selected areas;

c) conformally depositing a conductive barrier layer material overlying the trench and via, forming a conductive barrier layer on the sidewall surfaces of the dielectric interlevel first and second thicknesses and the metal level selected areas, whereby all the dual damascene surfaces are covered with the conductive barrier layer; and d) anisotropically etching, to selectively remove the conductive barrier layer overlying the metal level selected areas, exposing the metal level selected areas, but not the conductive barrier layer overlying the sidewall surfaces of the first dielectric interlevel first and second thicknesses, whereby a damascene process via and trench, having conductive barrier sidewall surfaces, are prepared to directly connect the metal level with a subsequently deposited copper metal level, without an intervening barrier layer, for improved conductivity.

11. A method as in claim 10 in which step b) exposes selected areas of a metal level material selected from the group consisting of aluminum, aluminum-copper alloys, and tungsten.

12. In an integrated circuit (IC) including a first metal horizontal level, a first barrier horizontal layer overlying the first metal level, and a first dielectric interlevel overlying the first barrier layer, the first dielectric interlevel having a first thickness and second thickness overlying the first thickness, a method for forming vertical sidewall barriers lining a low resistance dual damascene interconnect between metal levels without a horizontal barrier layer intervening between the first metal level and the dual damascene interconnect comprising the following steps:

a) etching selected areas of the first dielectric interlevel second thickness, forming a damascene interconnection trench, and exposing vertical sidewall surfaces of the first dielectric interlevel second thickness and selected horizontal surfaces of the first dielectric interlevel first thickness;

b) anisotropically depositing, in a horizontal direction, a second barrier layer over the first dielectric interlevel, to overlie the selected horizontal surfaces of the first dielectric interlevel first thickness exposed in step a), and minimally cover the vertical sidewall surfaces of the first dielectric interlevel second thickness;

c) etching selected overlying areas of the second barrier layer deposited in step b), selected horizontal surfaces of the first dielectric interlevel first thickness, and the first barrier layer, exposing vertical sidewall surfaces of the first dielectric interlevel first thickness and selected areas of the first metal level, whereby a via is formed from the trench to the first metal level selected areas;

d) conformally depositing a third barrier layer over the vertical sidewall surfaces of the first dielectric interlevel second thickness exposed in step a), the second barrier layer deposited in step b), and the first metal level selected areas and vertical sidewall surfaces of the first dielectric interlevel first thickness exposed in step c);

e) anisotropically etching, in the horizontal direction, to selectively remove the third barrier layer overlying the first metal level selected areas, exposing the first metal level selected areas, but not the third barrier layer overlying the vertical sidewall surfaces of the first dielectric interlevel first and second thicknesses, whereby a damascene process via and trench, having barrier surface sidewalls, are prepared to directly connect the first metal level with a metal subsequently deposited in the dual damascene structure for improved electrical conductivity.

13. A method as in claim 12 comprising the further step, following step e), of:

f) depositing a second metal level overlying the second barrier layer, filling the trench formed in step a) and the via formed in step b), to connect with the first metal level, whereby a minimum resistance connection, without an intervening barrier layer, is made between the metal levels.

14. A method as in claim 13 comprising the further step, following step f), of:

g) performing a chemical mechanical polish (CMP) of the second metal level;

h) depositing a fourth barrier layer overlying the second metal level, and a second dielectric interlevel overlying the fourth barrier layer;

j) repeating the steps of the method described in steps a) through f) to form a low resistance connection between the second metal level and a subsequently deposited metal level, whereby a plurality of metal levels in the IC are interconnected.

15. A method as in claim 12 in which the first and second barrier layer materials are non-conductive, and the third barrier layer material is selected from the group consisting of conductive and non-conductive materials.

16. A method as in claim 15 in which the non-conductive barrier layer material is selected from the group consisting of $Si_3N_4$ and TiO.

17. A method as in claim 15 in which the conductive barrier layer material is selected from the group consisting of refractory metals, and refractory metal compounds including TiN, WN, and TaN.

18. A method as in claim 12 in which the first metal level is copper.

19. A method as in claim 13 in which the first and second metal levels are copper.

* * * * *